(12) United States Patent
Steinacker

(10) Patent No.: US 7,279,943 B2
(45) Date of Patent: Oct. 9, 2007

(54) CIRCUIT ARRANGEMENT RECEIVING DIFFERENT SUPPLY VOLTAGES

(75) Inventor: Ulrich Steinacker, Putzbrunn (DE)

(73) Assignee: Infineon Technologies, AG, Neubiberg (DE)

( * ) Notice: Subject to any disclaimer, the term of this patent is extended or adjusted under 35 U.S.C. 154(b) by 38 days.

(21) Appl. No.: 11/249,810

(22) Filed: Oct. 13, 2005

(65) Prior Publication Data

US 2006/0082396 A1 Apr. 20, 2006

(30) Foreign Application Priority Data

Oct. 13, 2004 (DE) ...................... 10 2004 049 744

(51) Int. Cl.
*H03L 7/00* (2006.01)
(52) U.S. Cl. ...................... 327/143; 327/198
(58) Field of Classification Search ................ 327/143, 327/198
See application file for complete search history.

(56) References Cited

U.S. PATENT DOCUMENTS

| | | | |
|---|---|---|---|
| 4,300,065 A | 11/1981 | Remedi et al. ............. 327/436 |
| 5,214,316 A | 5/1993 | Nagai | |
| 5,392,205 A | 2/1995 | Zavaleta | |
| 5,703,510 A | 12/1997 | Iketani et al. ................ 327/143 |
| 6,097,225 A | 8/2000 | Smith .......................... 327/143 |
| 6,215,342 B1 * | 4/2001 | Morrill ........................ 327/143 |
| 6,469,552 B2 | 10/2002 | Ohbayashi et al. ......... 327/143 |
| 6,472,747 B2 | 10/2002 | Bazarjani et al. | |
| 6,621,328 B2 * | 9/2003 | Koike et al. ................ 327/540 |
| 7,049,865 B2 * | 5/2006 | Parker et al. ................ 327/143 |

FOREIGN PATENT DOCUMENTS

EP 0 482 661 A2 4/1992

\* cited by examiner

*Primary Examiner*—Kenneth B. Wells
(74) *Attorney, Agent, or Firm*—Edell, Shapiro & Finnan, LLC

(57) ABSTRACT

A circuit arrangement (1) has a first circuit block (2) operating at a first supply voltage and a second circuit block (3) operating at a second supply voltage. The first circuit block (2) is coupled to the second circuit block (3) by a voltage level shifting unit (4) in order to transmit a first activation or deactivation signal to the second circuit block (3). It likewise has a voltage level detector (5) which operates at the second supply voltage and is coupled to the voltage level shifting unit (4) and which can be supplied with the first supply voltage, and which is set up such that it outputs a first control signal if the voltage level of the first supply voltage is below a threshold value. The voltage level shifting unit (4) transmits the first deactivation signal to the second circuit block (3) when the voltage level detector (5) outputs the first control signal.

20 Claims, 3 Drawing Sheets

1

CIRCUIT ARRANGEMENT RECEIVING DIFFERENT SUPPLY VOLTAGES

CROSS-REFERENCE TO RELATED APPLICATIONS

This application claims foreign priority to Germany Application Number 10 2004 049 744.3 which was filed Oct. 13, 2004, and is herein incorporated by reference in its entirety.

TECHNICAL FIELD

The invention relates to a circuit arrangement.

BACKGROUND

In communications technology, particularly in mobile radio technology, a circuit arrangement frequently has two circuit blocks which operate at two different supply voltages. Such a circuit arrangement is a "mixed signal" circuit, for example, which has at least one analogue circuit block and at least one digital circuit block. These circuit blocks are often integrated in a single semiconductor component. The mixed-signal circuit usually requires two supply voltages at different levels, because the analogue circuit block normally operates at a higher supply voltage in comparison with the digital circuit block.

When the supply voltage for a digital circuit block is turned on, an output signal from a logic gate which the circuit block contains, for example a multivibrator or flip-flop, takes a random logic value. The output signal is initially therefore randomly set at the logic value "1", which usually corresponds to a high voltage level, or at the logic value "0", which usually corresponds to a low voltage level. As a result, it is necessary to put the logic gate in the circuit block into a desired or stipulated initial state using a reset signal. The predetermined initial state ensures reliable operation for the digital circuit block.

The reset to an initial state is also called "power-on reset". Normally, the reset signal is triggered when, during a turn-on operation, the voltage level of a rising supply voltage has reached or exceeded a particular threshold value. Such a power-on reset is likewise necessary when the supply voltage has dropped below the threshold value for a certain period. In this case, reliable operation of the circuit block is no longer ensured.

The fact that the circuit blocks operate at different supply voltages and that the supply voltages can be turned on and off independently of one another means that reliable operation of the circuit arrangement is not always ensured. This is the case particularly when a first circuit block actuates operation of a second circuit block. In a mixed-signal circuit, the analogue circuit block is started up, i.e. activated, and turned off, or deactivated, by the digital circuit block.

There is a possible operating state for the circuit arrangement in which the second circuit block is already supplied with a supply voltage which is sufficient for operation, whereas the operation of the first circuit block is not reliably ensured because the voltage level of the corresponding supply voltage is still too low. On the other hand, the situation may arise in which the first circuit block is already operating reliably, whereas an excessively low voltage level of the supply voltage is being applied to the second circuit block. This means that it is necessary when starting up the entire circuit arrangement to wait until the various supply voltages for the two circuit blocks have reached a respective sufficiently high voltage level.

To ensure reliable operation of the circuit arrangement, a reset signal for the first circuit block therefore cannot appear until after a certain waiting period. However, determining the waiting period requires a well-defined order for turning on the supply voltage as well as a well-known time profile for the voltage levels when turning on the supply voltage. This cannot always be ensured.

SUMMARY

The invention is based on the problem of providing a circuit arrangement having at least two circuit blocks operated at different supply voltages which is able to ensure reliable operation of the circuit arrangement regardless of turn-on profiles for the different supply voltages in the circuit blocks.

The circuit arrangement has a first circuit block operating at a first supply voltage and a second circuit block operating at a second supply voltage. The first circuit block is connected to the second circuit block via a voltage level shifting unit in order to transmit a first activation or deactivation signal to the second circuit block. The circuit arrangement likewise has a voltage level detector which operates at the second supply voltage and is coupled to the voltage level shifting unit and which is supplied with the first supply voltage, and which is designed such that it outputs a first control signal if the voltage level of the first supply voltage is below a threshold value. The voltage level shifting unit is designed such that it transmits the first deactivation signal to the second circuit block when the voltage level detector outputs the first control signal.

A basic concept behind the invention is that the second circuit block is deactivated when the first supply voltage is still too low in order to ensure safe operation of the first circuit block. Incorrect output signals from the first circuit block are thus not processed by the second circuit block. Only when the first supply voltage is above the threshold value is it possible for the second circuit block to be actuated by the first circuit block. Reliable operation of the circuit arrangement is ensured.

In one development, the circuit arrangement has a reset unit which operates at the first supply voltage and is coupled to the first circuit block. The reset unit is set up such that when the first supply voltage is turned on it transmits a reset signal in order to put the first circuit block into a defined initial state. The reset unit ensures that a logic gate situated in the first circuit block has a defined initial state after the first circuit block has been turned on. In addition, there is the assurance that the first supply voltage has already reached a voltage level which is high enough to ensure safe operation of the first circuit block.

In an additional development, the voltage level detector is coupled to the first circuit block via a second voltage level shifting unit in order to put the first circuit block into a defined initial state when the first control signal is present.

In one refinement, the circuit arrangement has a means which is coupled to the reset unit and to the voltage level detector and which supplies the reset signal or the first control signal to the first circuit block.

Supplying the reset signal and the first control signal ensures that the first circuit block is put into a defined initial state regardless of the order in which the first circuit block and the second block are turned on. Since the first circuit block is designed to activate or deactivate the second circuit block, reliable operation of the circuit arrangement can be ensured on the whole.

In one refinement, the reset unit comprises a threshold value detector and a delay element. Using the threshold value detector, the reset unit produces a signal when the first supply voltage is higher than the threshold value. This signal is delayed by the delay element and is output to the first circuit block. The first circuit block receives the reset signal only when, during a turn-on operation for the circuit arrangement, the first supply voltage is sufficiently high to ensure reliable operation of the first circuit block. Delaying the reset signal is advantageous particularly for slow turn-on profiles.

In a further refinement, the threshold value detector is set up such that its drawn current is essentially zero when the voltage level of the first supply voltage is above the threshold value. This means that the reset unit does not draw any current after the first circuit block is started up. This is advantageous particularly for circuit arrangements with limited current resources, such as in the case of mobile electronic appliances.

In one development, the first circuit block is a digital circuit block. This comprises a hardwired logic switching mechanism in one development. Alternatively, it comprises a programmable logic switching mechanism, particularly a digital signal processor or DSP.

The second switching block usually has an analogue circuit. This typically comprises one of the following analogue circuits:

a voltage-controlled oscillator or VCO, a phase locked loop or PLL, a circuit for modulating and/or demodulating an analogue signal, and/or an amplifier circuit.

In one development, the circuit arrangement has at least one third circuit block operating at a second supply voltage. The first circuit block is connected to the third circuit block via a second voltage level shifting unit in order to transmit a second activation or deactivation signal to the third circuit block. The second voltage level shifting unit is coupled to the voltage level detector. The second voltage level shifting unit transmits a second deactivation signal to the third circuit block when the voltage level detector outputs the first control signal.

Advantageously, the second circuit block and the third circuit block, which are operated at the second supply voltage, can be activated or deactivated independently of one another by the first circuit block. This development is therefore found to be particularly advantageous in a circuit arrangement with a limited resource for the second supply voltage, for example a battery or a storage battery.

BRIEF DESCRIPTION OF THE DRAWINGS

The invention is explained in more detail below using an exemplary embodiment with reference to the drawings, in which.

DETAILED DESCRIPTION

Figure 1:
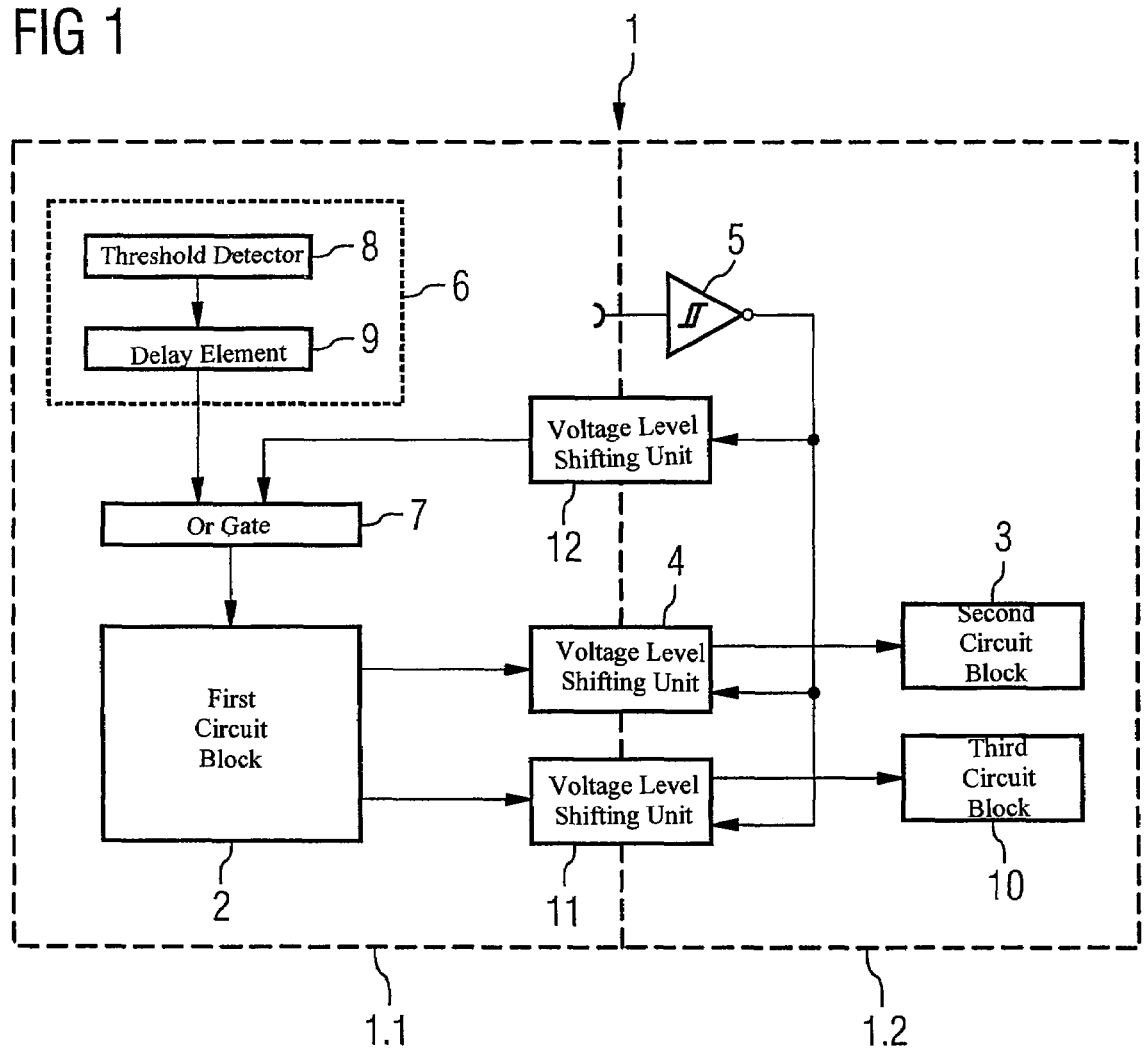
FIG. 1 shows a schematic illustration of an exemplary embodiment of a circuit arrangement based on the invention.

FIG. 1 shows the schematic illustration of an exemplary embodiment of a circuit arrangement 1 (shown in dashes) based on the invention. The circuit arrangement 1 has a first supply voltage domain 1.1 and a second supply voltage domain 1.2. Logic gates in the circuit arrangement 1 which are arranged in the first supply voltage domain 1.1 are supplied with a first supply voltage. Logic gates in the circuit arrangement 1 which are arranged in the second supply voltage domain 1.2 are supplied with a second supply voltage. Normally, the first supply voltage and the second supply voltage have voltage levels which differ from one another. In the case of a mixed-signal circuit, for example, the voltage level of the first supply voltage is lower than the value of the second supply voltage. Typical values for the voltage levels in a mixed-signal circuit are 1.5V and 2.5V. However, it is likewise conceivable for the voltage levels of the first supply voltage and of the second supply voltage to be essentially the same, and for the first supply voltage to be provided from a different voltage source from the second supply voltage.

The first supply voltage domain 1.1 contains a first circuit block 2 which is coupled to a second circuit block 3 by means of a voltage level shifting unit 4. The first circuit block 4 is therefore able to transmit a first activation or deactivation signal to the second circuit block 3. The first circuit block 2 is therefore a control unit which uses the first activation or deactivation signal to control the operation of the second circuit block 3. This is usually done using a digital first activation or deactivation signal. The voltage level shifting unit 4 matches the voltage levels of the first activation or deactivation signal in the first supply voltage domain to the necessary voltage level for the first activation or deactivation signal in the second supply voltage domain.

In the exemplary embodiment shown, the voltage level shifting unit 4 sends an activation signal which corresponds to a voltage level at the level of the second supply voltage—that is to say a logic value "1"—and a first deactivation signal in the form of a low voltage level or zero potential—that is to say a logic value "0"—to the second circuit block 3. Once the second circuit block 3 receives the activation signal, it is in operation. Once the circuit block 3 receives the first deactivation signal, it is shut down.

The second supply voltage domain 1.2 equally contains a voltage level detector 5 which is coupled to the voltage level shifting unit 4. The voltage level detector 5 is supplied with the second supply voltage. The first supply voltage is supplied to it via a first input. In the illustration, the voltage level detector 5 is in the form of a Schmitt trigger with an inverting output. However, it is likewise conceivable for the voltage level detector 5 to be in the form of an inverter circuit, a comparator circuit or comparable circuits. The inverting output of the voltage level detector 5 is coupled to the voltage level shifting unit 4.

In the exemplary embodiment shown, the voltage level detector 5 sends a first control signal in the form of a voltage level at the level of the second supply voltage—that is to say a logic value "1"—to the voltage level shifting unit 4 if the first supply voltage is lower than a threshold value from the voltage level detector 5. The first control signal is output when the logic gates in the first supply voltage domain 1.1 or in the second supply voltage domain 1.2 are not yet operating reliably.

The first control signal is used to turn off the voltage level shifting unit 4, as a result of which the latter transmits a zero potential and hence a first deactivation signal to the second circuit block 3. The second circuit block 3 is shut down if the first supply voltage is too low to ensure the operation of the respectively supplied logic gates.

The first supply voltage domain 1.1 contains a reset unit 6 (shown in a dotted line) for producing a first reset signal, said reset unit being connected to the first circuit block 3 via an OR gate 7. The OR gate 7 is likewise supplied with the first control signal. In this case, the voltage level of the first control signal is matched to the first supply voltage using a second voltage level shifting unit 12. The OR gate 7 sends a second reset signal to the first circuit block 2 when the OR gate 7 is supplied with the first reset signal and/or with the first control signal.

In the exemplary embodiment, there is additionally a third circuit block 10 which is connected to the first circuit block 2 via a third voltage level shifting unit 11. Thus, the first circuit block 2 can transmit a first activation or deactivation signal to the third circuit block 10. The third voltage level shifting unit 11 is coupled to the voltage level detector 5 and is turned off when the voltage level detector 5 outputs the first control signal. In this case, the third voltage level shifting unit 11 transmits a second deactivation signal to the third circuit block 10 in order to deactivate it.

The reset unit 6 contains a threshold detector unit 8 and a delay element 9. In this case, the threshold detector unit 8 outputs a signal when the voltage level of the first supply voltage is above a first threshold value. The signal is delayed by a time interval by the delay element 9 and is then output by the reset unit 6 as a reset signal. The time delay ensures that during a turn-on operation the voltage level of the first supply voltage is safely above the first threshold value.

Two different scenarios are obtained for the turn-on operation for the circuit arrangement 1.

If the first supply voltage reaches a voltage level which is sufficient for operation of the first circuit block 2 before the second supply voltage reaches a corresponding second threshold value, the following occurs.

The reset unit 6 outputs a reset signal with a time delay, and said reset signal is forwarded via the OR gate 7 to the first circuit block 2. The first circuit block 2 remains set at its initial state.

In the other case, where the voltage level of the second supply voltage first of all exceeds the second threshold value before the voltage level of the first supply voltage is high enough, the following occurs.

The voltage level detector 5 is on standby, since it is receiving the necessary second supply voltage. However, the voltage level of the first supply voltage is below the threshold value, which means that the voltage level detector 5 outputs the first control signal. This signal is supplied to the voltage level shifting unit 4 and to the third voltage level shifting unit 11, so that these are turned off. The first deactivation signal and the second deactivation signal are therefore transmitted to the second circuit block 3 and to the third circuit block 10, respectively. The second circuit block 4 and the third circuit block 10 are turned off.

When the voltage level of the first supply voltage reaches the threshold value, the voltage level detector 5 does not transmit a first control signal to the voltage level shifting unit 4 and to the third level shifting unit 11. The reset unit 6 outputs a reset signal with a time delay, and this reset signal is forwarded in the form of the second reset signal from the OR gate 7 to the first circuit block 2. The latter is thus put into the defined initial state and can actuate the operating states of the second circuit block 3 and of the third circuit block 10.

Figure 2:
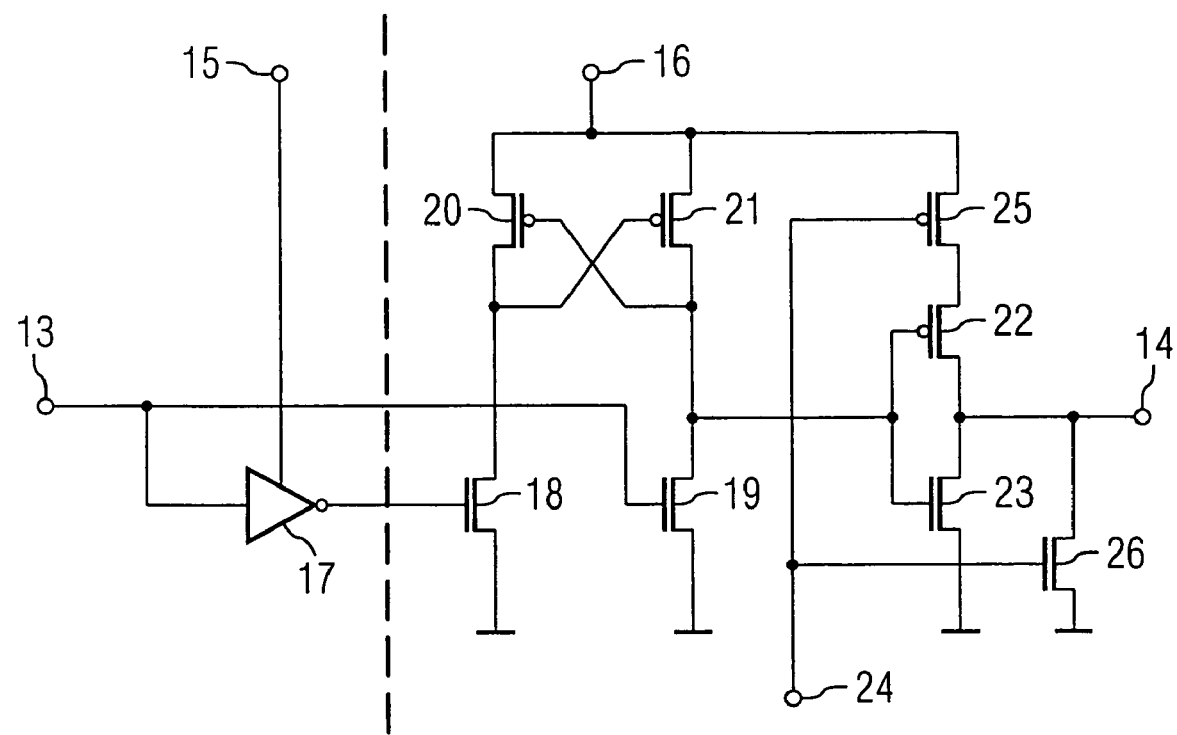
FIG. 2 shows a schematic illustration of a voltage level shifting unit.

FIG. 2 shows a schematic illustration of a voltage level shifting unit, as may be used in the exemplary embodiment shown in FIG. 1, for example.

The voltage level shifting unit is supplied with a data signal at a first voltage level via a first signal input 13. A first signal output 14 is used to output the data signal at a second voltage level.

The first signal input 13 is coupled to an inverter 17 by means of lines. The inverter 17 is supplied with a first supply voltage via a first supply voltage connection 15. The first voltage level of the first supply voltage essentially corresponds to a high voltage level (high level) of the data signal. An output of the inverter 17 is connected to the gate connection of a first n-MOS transistor 18. In this case, the source connection of the first n-MOS transistor 18 is coupled to an earth potential. The drain connection of the first n-MOS transistor 18 is coupled to the source connection of a first p-MOS transistor 20.

The first signal input 13 is additionally connected to the gate connection of a second n-MOS transistor 19. The source connection of the second n-MOS transistor 19 is coupled to an earth potential. The drain connection of the second n-MOS transistor 19 is connected to the source connection of a second p-MOS transistor 21.

The drain connection of the first p-MOS transistor 20 and the drain connection of the second p-MOS transistor 21 are connected to a second supply voltage connection 16, to which a second supply voltage at the second voltage level is supplied. The gate connection of the first p-MOS transistor 20 is connected to the source connection of the second p-MOS transistor 21. In the same form, the gate connection of the second p-MOS transistor 21 is connected to the source connection of the first p-MOS transistor 20. An intermediate signal tapped off between the drain connection of the second n-MOS transistor 19 and the source connection of the second p-MOS transistor 21 is supplied to a first inverter circuit.

The first inverter circuit has a third n-MOS transistor 23 and a third p-MOS transistor 22. In this arrangement, these are connected such that the source connection of the third n-MOS transistor 23 is coupled to an earth potential. The drain connection of the third n-MOS transistor 23 is connected to the source connection of the third p-MOS transistor 22. The drain connection of the third p-MOS transistor 22 is connected to the source connection of a fourth p-MOS transistor 25. The drain connection of the fourth p-MOS transistor 25 is connected to a second supply voltage connection 16, to which a second supply voltage at the second voltage level is supplied. The gate connection of the fourth p-MOS transistor 25 is connected to a control connection 24 to which a control signal can be supplied.

An output signal tapped off between the drain connection of the fourth n-MOS transistor 26 and the source connection of the fourth p-MOS transistor 25 is supplied to the first signal output 14. In this case, the first signal output 14 is coupled to an earth potential via the source/drain path of the fourth n-MOS transistor 26. The gate connection of the fourth n-MOS transistor 26 is connected to control connection 24.

The operation of the voltage level shifting unit shown is explained in more detail below.

The first signal input 13 has a potential corresponding to the voltage level of the first supply voltage applied to it. This potential usually corresponds to a logic value "1" in a first supply voltage domain. Hence, the inverter 17 is used to turn off the source/drain path of the first n-MOS transistor 18 and to turn on the source/drain path of the second n-MOS transistor 19. This is synonymous with the source/drain path of the first p-MOS transistor 20 being off while the source/drain path of the second p-MOS transistor 21 is on. The intermediate signal accordingly has a voltage level which corresponds to a zero potential. The subsequent first inverter circuit produces an output signal which corresponds to a logic value "1". Since the inverter circuit is being operated at the second supply voltage, the output signal has a potential which corresponds to the voltage level of the second supply voltage.

Similarly, the operation of the voltage level shifting unit can be reconstructed when the input signal has a voltage level which corresponds to a zero potential and hence represents a logic value "0". No shift in the voltage level in the actual sense takes place, since the output signal likewise represents a logic value "0".

The control connection 24 allows the voltage level shifting unit to be turned off. When a logic value "0" is applied to the control connection, the fourth p-MOS transistor is switched such that its source/drain path is on. By contrast, the source/drain path of the fourth n-MOS transistor 26 is off. The voltage level shifting unit accordingly operates as set out above.

When a logic value "1" is applied to the control connection 24, the source/drain path of the fourth p-MOS transistor 25 is off and the source/drain path of the fourth n-MOS transistor 26 is on. As a result, an earth potential is always applied to the first signal output regardless of the input signal. The output signal has a logic value "0" regardless of the input signal. The voltage level shifting unit is off or shut down.

Figure 3:
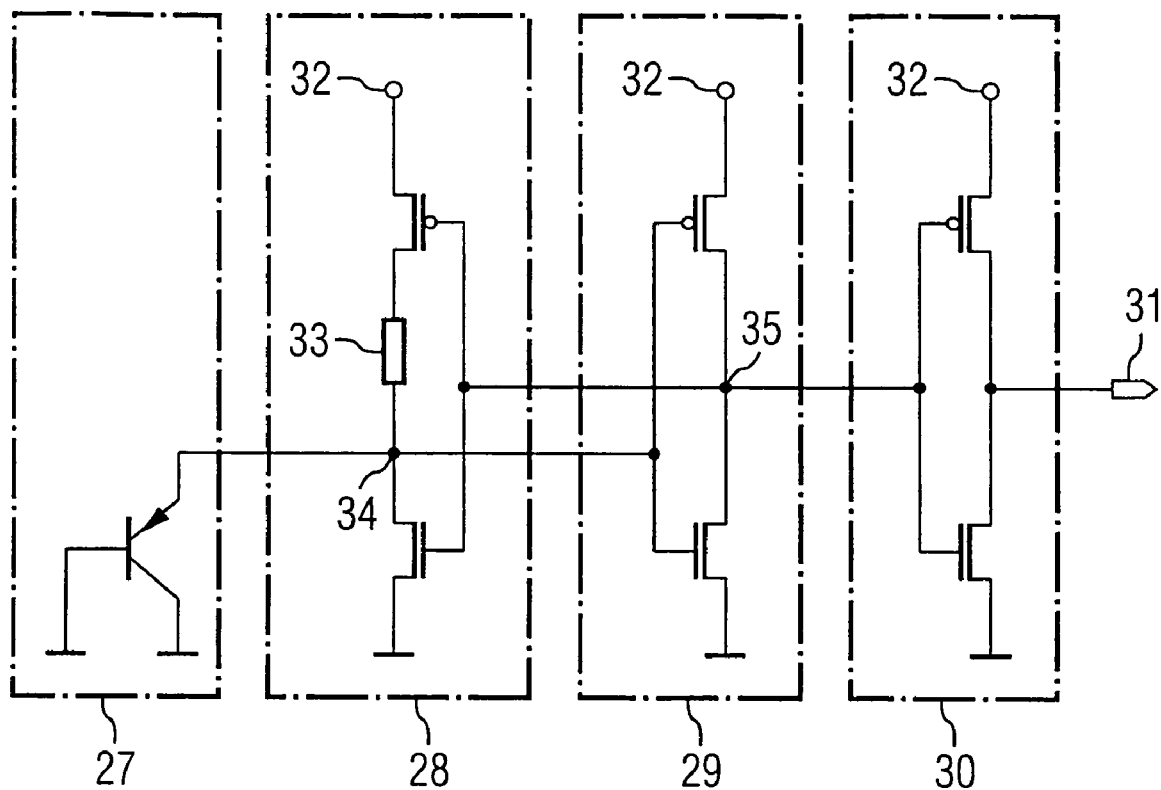
FIG. 3 shows a schematic illustration of a reset unit.

FIG. 3 shows a schematic illustration of a reset unit, as may be used in FIG. 1. The reset unit has a current source 27, a first inverter 28, a second inverter 29 and a third inverter 30. The inverters are respectively supplied with a supply voltage $V_{dd}$ via a supply voltage input 32. They each have an identical circuit comprising a p-MOS transistor and an n-MOS transistor. In this case, the source/drain path of the p-MOS transistor is connected to the supply voltage input 32 and to the inverter output, and the source/drain path of the n-MOS transistor is connected to the inverter output and to to an earth connection.

The gate connections of the p-MOS transistor and of the n-MOS transistor are connected to the inverter input. The first inverter additionally has a resistor 33 connected between the source/drain path of the p-MOS transistor and the inverter output. The gain of the n-MOS transistor in the first inverter 28 is greater than the gain of the n-MOS transistor in the second inverter 29.

The current source 27 comprises a transistor whose collector connection and base connection are connected to an earth potential. The emitter connection of the transistor is connected to the inverter output of the first inverter 28. This inverter output has a first voltage node 34 connected to it. The first voltage node 34 is likewise linked to the inverter input of the second inverter 29. The inverter output of the second inverter 29 is connected to the inverter input of the first inverter 28 and to the inverter input of the third inverter 30. It has a second voltage node 35 on it. The inverter output of the third inverter is simultaneously the reset signal output 31.

This produces the following manner of operation for the reset unit: the switching point of the first inverter 28 is obtained from the arithmetic mean of the supply voltage $V_{dd}$ and of the base/emitter voltage of the transistor in the current source 27. Initially, the current level of the supply voltage $V_{dd}$ at the supply voltage input 32 is a zero potential, and the first voltage node 34 and the second voltage node 35 are discharged. The p-MOS transistors and n-MOS transistors in the inverters in the reset unit have a high impedance, and the collector current of the transistor in the current source 27 corresponds to 0 mA.

If the voltage level of the supply voltage $V_{dd}$ rises but remains lower than the emitter/base voltage on the transistor in the current source 27 then the voltage level at the second voltage node 35 continues to be at zero level. The n-MOS transistor in the first inverter 28 is still off and the p-MOS transistor in the first inverter 28 has a source/drain path which is on. The voltage at the first voltage node 34 therefore rises with the supply voltage $V_{dd}$. If the supply voltage $V_{dd}$ exceeds the diode voltage applied between the base and emitter connections of the transistor in the current source 27 then the collector current in the same transistor increases, with the diode voltage remaining almost constant. The resistor 33 limits the current on the current source 27 and therefore keeps down the total current drawn by the reset unit.

In the course of the supply voltage $V_{dd}$ rising, a potential difference develops between said supply voltage and the voltage level at the first voltage node 34, said potential difference increasing as the supply voltage $V_{dd}$ rises. If the voltage level of the supply voltage $V_{dd}$ reaches the switching point of the first inverter 28, the first inverter 28 switches its inverter output to the voltage level of the supply voltage $V_{dd}$, the source/drain path of the n-MOS transistor in the first inverter 28 is turned on and pulls the first voltage node 34 to an earth potential. The p-MOS transistor in the first inverter is turned off, on the other hand. The flow of current in the current source 27 is turned off. No currents flow in the reset unit. The effect which is thus achieved is that after the reset signal is triggered no power is consumed in the reset unit.

Figure 4:
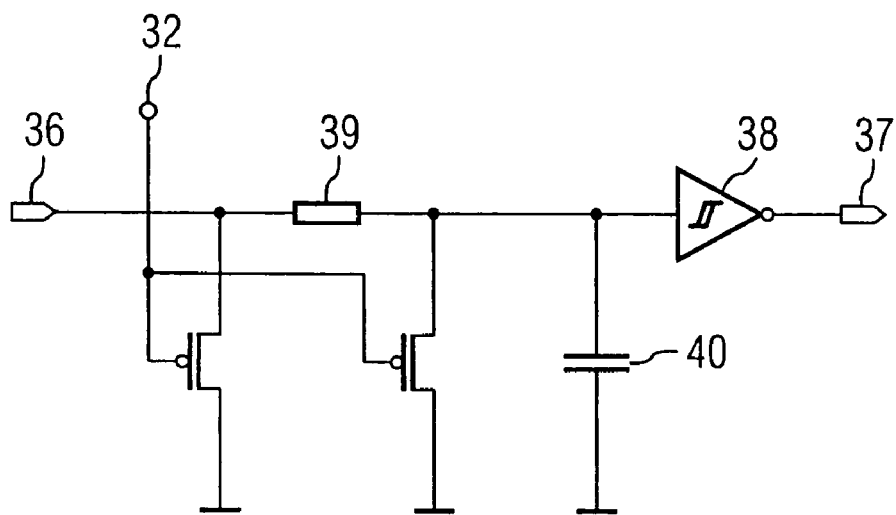
FIG. 4 shows a schematic illustration of a delay element.

FIG. 4 shows a schematic illustration of a delay element. A delay signal input 36 is connected to the input of a Schmitt trigger 38 via a second resistor 39. The output of the Schmitt trigger 30 is connected to a delay signal output 37. Between the second resistor 39 and the input of the Schmitt trigger 38, a connecting line is coupled to the earth potential via a capacitor 40. In a manner which is known to a person skilled in the art, this circuit outputs a signal, which is input at the delay signal input 36, at the delay signal output 37 delayed by a time interval, the time interval being determined by the capacitance value of the capacitor 40 and by the resistance value of the second resistor 39.

In addition, two p-MOS transistors are coupled to the connections of the second resistor 39 and couple it to the earth potential via their source/drain paths. The gate connections of the p-MOS transistors are coupled to a supply voltage input 32 which supplies them with a supply voltage. When the voltage level of the supply voltage is at a zero level, the capacitor 40 is discharged in this way, or a zero potential is applied to the input of the Schmitt trigger 38 and hence also to the delay signal output 37.

LIST OF REFERENCE SYMBOLS

Circuit arrangement 1
First supply voltage domain 1.1
Second supply voltage domain 1.2
First circuit block 2
Second circuit block 3
Voltage level shifting unit 4
Voltage level detector 5
Reset unit 6

OR gate 7
Threshold detector unit 8
Delay element 9
Third circuit block 10
Third voltage level shifting unit 11
Second voltage level shifting unit 12
First signal input 13
First signal output 14
First supply voltage connection 15
Second supply voltage connection 16
Inverter 17
First n-MOS transistor 18
Second n-MOS transistor 19
First p-MOS transistor 20
Second p-MOS transistor 21
Third p-MOS transistor 22
Third n-MOS transistor 23
Control connection 24
Fourth p-MOS transistor 25
Fourth n-MOS transistor 26
Current source 27
First inverter 28
Second inverter 29
Third inverter 30
Reset signal output 31
Supply voltage input 32
Resistor 33
First voltage node 34
Second voltage node 35
Delay signal input 36
Delay signal output 37
Schmitt trigger 38
Second resistor 39
Capacitor 40

The invention claimed is:

1. A circuit arrangement comprising:
   a first circuit block operating at a first supply voltage,
   a second circuit block operating at a second supply voltage,
   wherein the first circuit block is coupled to the second circuit block by a voltage level shifting unit in order to transmit a first activation or deactivation signal to the second circuit block, and
   a voltage level detector which operates at the second supply voltage and is coupled to the voltage level shifting unit and which can be supplied with the first supply voltage, and which is operable to output a first control signal if the voltage level of the first supply voltage is below a threshold value,
   wherein the voltage level shifting unit transmits the first deactivation signal to the second circuit block when the voltage level detector outputs the first control signal, and
   a reset unit which operates at the first supply voltage and is coupled to the first circuit block and which is operable to transmit a reset signal when the first supply voltage is turned on in order to set the first circuit block to a defined initial state.

2. A circuit arrangement according to claim 1, wherein the voltage level detector is coupled to the first circuit block via a second voltage level shifting unit in order to set the first circuit block to a defined initial state when the first control signal is present.

3. A circuit arrangement according to claim 2, further comprising a means which is coupled to the reset unit and to the voltage level detector and which supplies the reset signal or the first control signal to the first circuit block.

4. A circuit arrangement according to claim 1, wherein the reset unit comprises a threshold value detector and a delay element.

5. A circuit arrangement according to claim 4, wherein the threshold value detector is operable to draw current which is essentially zero when the voltage level of the first supply voltage is above the threshold value.

6. A circuit arrangement according to claim 1, wherein the first circuit block is a digital circuit block.

7. A circuit arrangement according to claim 6, wherein the digital circuit block comprises a hardwired logic switching mechanism.

8. A circuit arrangement according to claim 6, wherein the digital circuit block comprises a programmable logic switching mechanism.

9. A circuit arrangement according to claim 1, wherein the second circuit block comprises an analogue circuit.

10. A circuit arrangement according to claim 1, wherein the second circuit block comprises at least one of the following analogue circuits:
    a voltage-controlled oscillator,
    a phase locked loop,
    a circuit for modulating and/or demodulating an analogue signal, or
    an amplifier circuit.

11. A circuit arrangement according to claim 1, further comprising at least one third circuit block operating at a second supply voltage,
    wherein the first circuit block is connected to the third circuit block via a second voltage level shifting unit in order to transmit a second activation or deactivation signal to the third circuit block,
    wherein the second voltage level shifting unit is coupled to the voltage level detector, and
    wherein the second voltage level shifting unit transmits a second deactivation signal to the third circuit block when the voltage level detector outputs the first control signal.

12. A circuit arrangement comprising:
    first circuit block coupled with a first supply voltage,
    a second circuit block coupled with a second supply voltage,
    a voltage level shifting unit coupled between the first circuit block and the second circuit block, and
    a voltage level detector which is coupled with the first supply voltage, and which comprises a control output coupled with the voltage level shifting unit for outputting a first control signal if the voltage level of the first supply voltage is below a threshold value, wherein the voltage level detector is coupled to the first circuit block via a second voltage level shifting unit in order to set the first circuit block to a defined initial state when the first control signal is present,
    wherein the voltage level shifting unit comprises an enable output coupled with the second circuit block for transmitting an enable signal based on the first control signal.

13. A circuit arrangement according to claim 12, further comprising a reset unit coupled with the first supply voltage and with the first circuit block and which is operable to transmit a reset signal when the first supply voltage is turned on in order to set the first circuit block to a defined initial state.

14. A circuit arrangement according to claim 12, further comprising a means which is coupled to the reset unit and to the voltage level detector and which supplies the reset signal or the first control signal to the first circuit block.

15. A circuit arrangement according to claim 13, wherein the reset unit comprises a threshold value detector and a delay element.

16. A circuit arrangement according to claim 15, wherein the threshold value detector is operable to draw current which is essentially zero when the voltage level of the first supply voltage is above the threshold value.

17. A circuit arrangement according to claim 12, wherein the first circuit block is a digital circuit block.

18. A circuit arrangement according to claim 17, wherein the digital circuit block comprises a hardwired logic switching mechanism.

19. A circuit arrangement comprising:
- a first circuit block operating at a first supply voltage,
- a second circuit block operating at a second supply voltage,
- wherein the first circuit block is coupled to the second circuit block by a first voltage level shifting unit in order to transmit a first activation or deactivation signal to the second circuit block, and
- a voltage level detector which operates at the second supply voltage and is coupled to the first voltage level shifting unit and which can be supplied with the first supply voltage, and which is operable to output a first control signal if the voltage level of the first supply voltage is below a threshold value, wherein the voltage level detector is coupled to the first circuit block via a second voltage level shifting unit in order to set the first circuit block to a defined initial state when the first control signal is present
- wherein the voltage level shifting unit transmits the first deactivation signal to the second circuit block when the voltage level detector outputs the first control signal.

20. A circuit arrangement comprising:
- a first circuit block operating at a first supply voltage,
- a second circuit block operating at a second supply voltage comprising an analogue circuit,
- where the first circuit block is coupled to the second circuit block by a voltage level shifting unit in order to transmit a first activation or deactivation signal to the second circuit block, and
- a voltage level detector which operates at the second supply voltage and is coupled to the first voltage level shifting unit and which can be supplied with the first supply voltage, and which is operable to output a first control signal if the voltage level of the first supply voltage is below a threshold value,
- wherein the voltage level shifting unit transmits the first deactivation signal to the second circuit block when the voltage level detector outputs the first control signal.

* * * * *